United States Patent
Takenaka

(10) Patent No.: US 7,999,574 B2
(45) Date of Patent: Aug. 16, 2011

(54) LEVEL CONVERSION CIRCUIT AND SOLID-STATE IMAGING DEVICE USING THE SAME

(75) Inventor: Kyoichi Takenaka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/814,000

(22) Filed: Jun. 11, 2010

(65) Prior Publication Data

US 2011/0006809 A1    Jan. 13, 2011

(30) Foreign Application Priority Data

Jul. 7, 2009  (JP) .................... 2009-161230

(51) Int. Cl.
*H03K 19/0175* (2006.01)
*H03K 19/094* (2006.01)
(52) U.S. Cl. ............... 326/80; 326/81; 326/68; 327/333
(58) Field of Classification Search ............ 326/63, 326/68, 80, 81; 327/333; 348/294, 301, 348/308; 345/98
See application file for complete search history.

(56) References Cited

U.S. PATENT DOCUMENTS

| | | | |
|---|---|---|---|
| 5,502,406 A | 3/1996 | Traynor et al. | |
| 6,642,769 B1 * | 11/2003 | Chang et al. | ............ 327/333 |
| 6,784,719 B2 | 8/2004 | Okamoto et al. | |
| 6,940,332 B2 | 9/2005 | Yamahira et al. | |
| 7,259,610 B1 | 8/2007 | Bell et al. | |
| 7,388,403 B1 * | 6/2008 | Yang | .................. 326/68 |
| 7,671,655 B2 | 3/2010 | Takenaka et al. | |

FOREIGN PATENT DOCUMENTS

JP    2002-76882    3/2002

* cited by examiner

*Primary Examiner* — Daniel D Chang
(74) *Attorney, Agent, or Firm* — Oblon, Spivak, McClelland, Maier & Neustadt, L.L.P.

(57) ABSTRACT

According to one embodiment, a level conversion circuit includes an intermediate voltage generating portion to generate an intermediate voltage between a first voltage and a second voltage upon receiving the first voltage and the second voltage higher than the first voltage. A buffer portion operates on the intermediate voltage upon receiving a first signal and an inverted first signal of a first amplitude corresponding to the first voltage. The buffer portion outputs a second signal and an inverted second signal having a second amplitude corresponding to the intermediate voltage. A level shift portion operates on the second voltage upon receiving the second signal and the inverted second signal, and outputs a third signal and an inverted third signal having a third amplitude corresponding to the second voltage.

17 Claims, 6 Drawing Sheets

$MVdd = LVdd+Vgs = LVdd+Vthp+ \Delta V \doteqdot LVdd+Vthp$

MVdd = Vin = LVdd+Vgs = LVdd+Vthp+ $\Delta$V

US 7,999,574 B2

LEVEL CONVERSION CIRCUIT AND SOLID-STATE IMAGING DEVICE USING THE SAME

CROSS-REFERENCE TO RELATED APPLICATIONS

This application is based upon and claims the benefit of priority from prior Japanese Patent Application No. 2009-161230, filed Jul. 7, 2009, the entire contents of which are incorporated herein by reference.

FIELD

Embodiments described herein relate generally to a level conversion circuit and a solid-state imaging device using the same.

BACKGROUND

In a conventional level conversion circuit, a positive feedback operation is used. The level conversion circuit includes first and second P channel MOS transistors in which drains and gates of the first and second P channel MOS transistors are cross-coupled each other. Further the first and second P channel MOS transistors are connected to respective drains of first and second N channel MOS transistors as loads. According to the conventional level conversion circuit, when a difference between voltages before and after a level shift becomes large, even if an input signal is inverted, an output signal is not completely inverted. Therefore, the conventional level shift circuit has a problem that the operation becomes unstable.

In order to solve this problem, it is necessary to make a drain current that flows in either one of the first and second N channel MOS transistors, which is rendered conductive by an inverse operation, sufficiently larger than that flowing in either one of the first and second P channel MOS transistors, which is rendered non-conductive, in an early stage of the inverse operation.

Then, although a gate width of the respective first and second N channel MOS transistors is made larger in order to improve a driving capability, a high speed operation is not achieved because a parasitic capacitance increases. Moreover, the above circuit results in increases in a current consumption and a circuit area.

On the other hand, for example, Japanese patent application Laid Open No. 2002-76882 describes a semiconductor integrated circuit device in which a level shift operation is fully conducted even if a ratio of the voltages before and after the level shifts is set large.

The semiconductor integrated circuit device shown in the Japanese patent application includes a level shift circuit having an input node into which an input signal with a first amplitude is inputted, and an output node from which a signal with a second different amplitude is outputted. The level shift circuit carries out a level shift operation of the input signal with the first amplitude to the output signal with the second amplitude. The level shift circuit further includes a current mirror circuit which charges the output node, and a switch circuit which operates the current mirror circuit after the input signal is inverted until the inverse of the output signal is completed.

However, when a frequency of the input signal becomes high, the level conversion circuit shown in the above patent application requires time for stopping the operation of the current mirror circuit, therefore which results in an insufficient inverse of the output signal and a problem of an insufficient operation of the level conversion circuit.

BRIEF DESCRIPTION OF THE DRAWINGS

The accompanying drawings, which are incorporated in and constitute a portion of the specification, illustrate embodiments of the invention, and together with the general description given above and the detailed description of the embodiments given below, serve to explain the principles of the invention.

DETAILED DESCRIPTION

Figure 1:
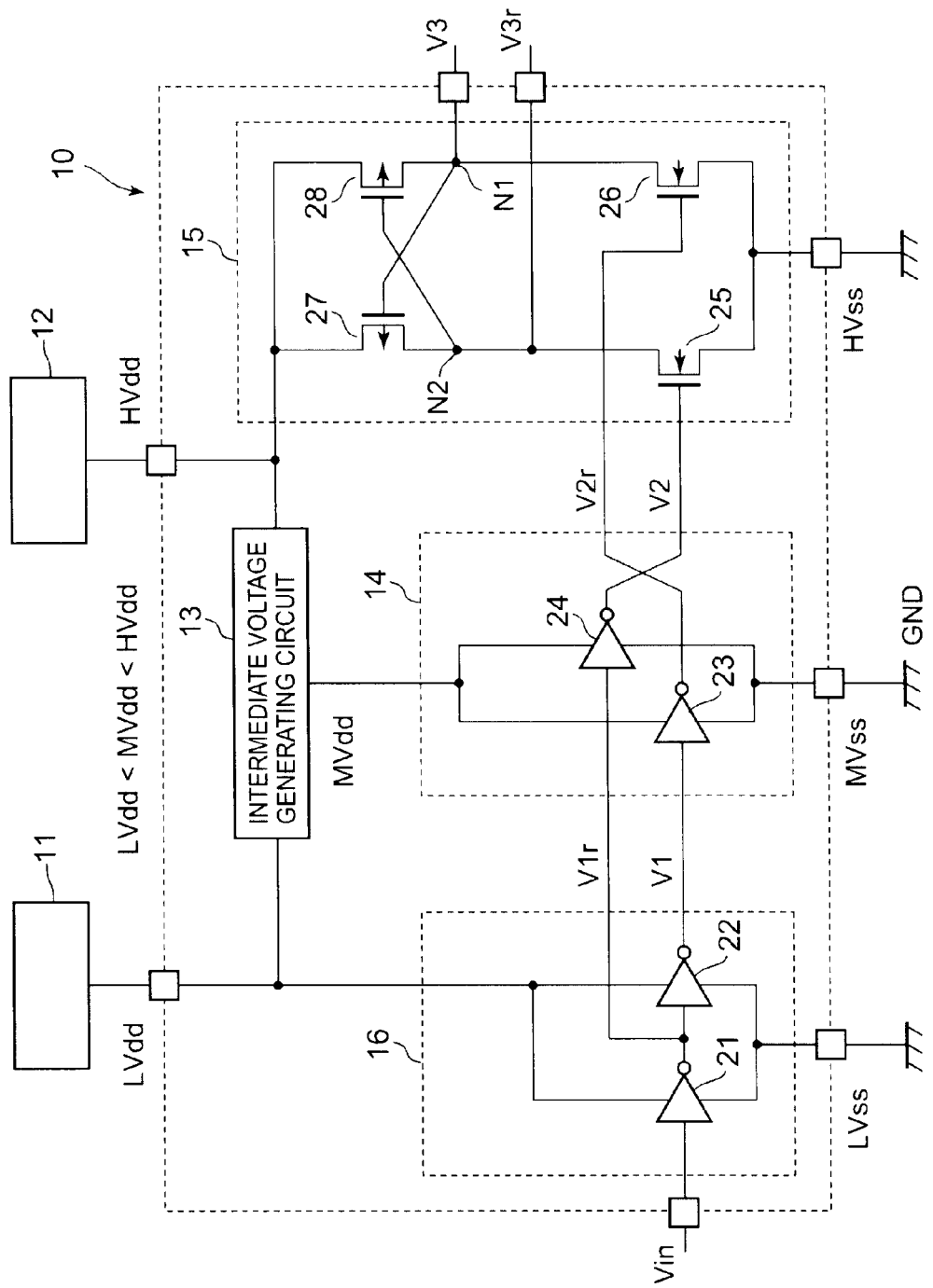
FIG. 1 is a circuit diagram showing a level conversion circuit according to an embodiment of the present invention.

According to an exemplary embodiment of the present invention will now be described with reference to the accompanying drawings wherein the same or like reference numerals designate the same or corresponding portions throughout the several views.

According to an embodiment, a level conversion circuit includes an intermediate voltage generating portion to generate an intermediate voltage between a first voltage supplied from a first power supply source and a second voltage supplied from a second power supply source upon receiving the first voltage and the second voltage higher than the first voltage; a first buffer portion operated by the intermediate voltage and to receive a first signal of a first amplitude corresponding to the first voltage and an inverted first signal, the first buffer portion outputting a second signal having a second amplitude corresponding the intermediate voltage and an inverted second signal; and a level shift portion operated by the second voltage to receive the second signal and the inverted second signal, and to output a third signal and an inverted third signal having a third amplitude corresponding to the second voltage.

Figure 2A:
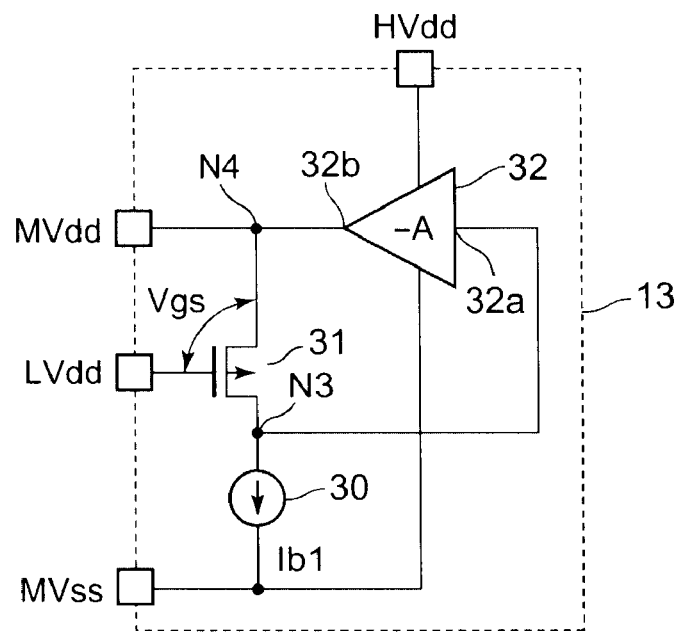
FIGS. 2A and 2B are circuit diagrams showing an intermediate voltage generating portion used in the level conversion circuit according to the first embodiment shown in FIG. 1.
Figure 2B:
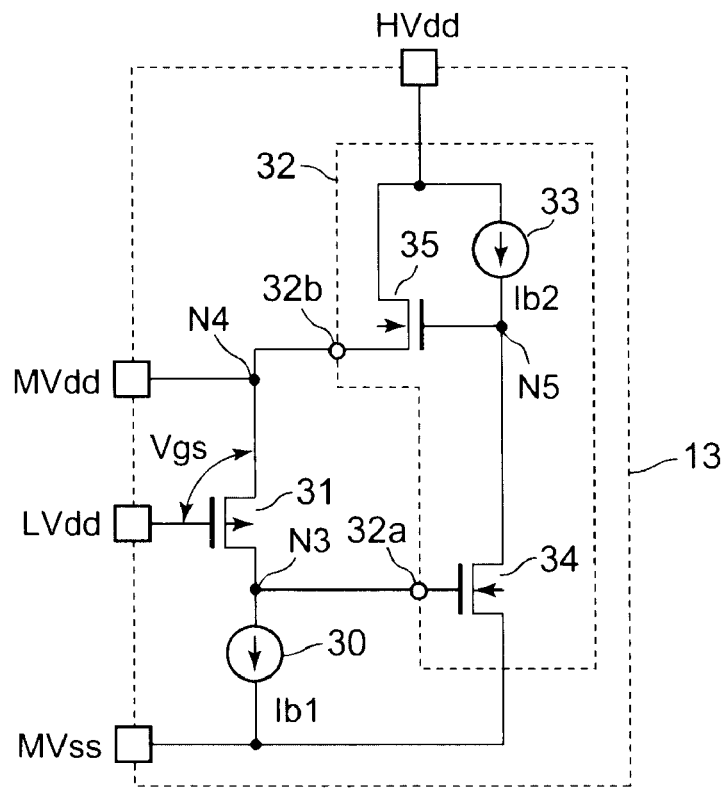
Figure 3:
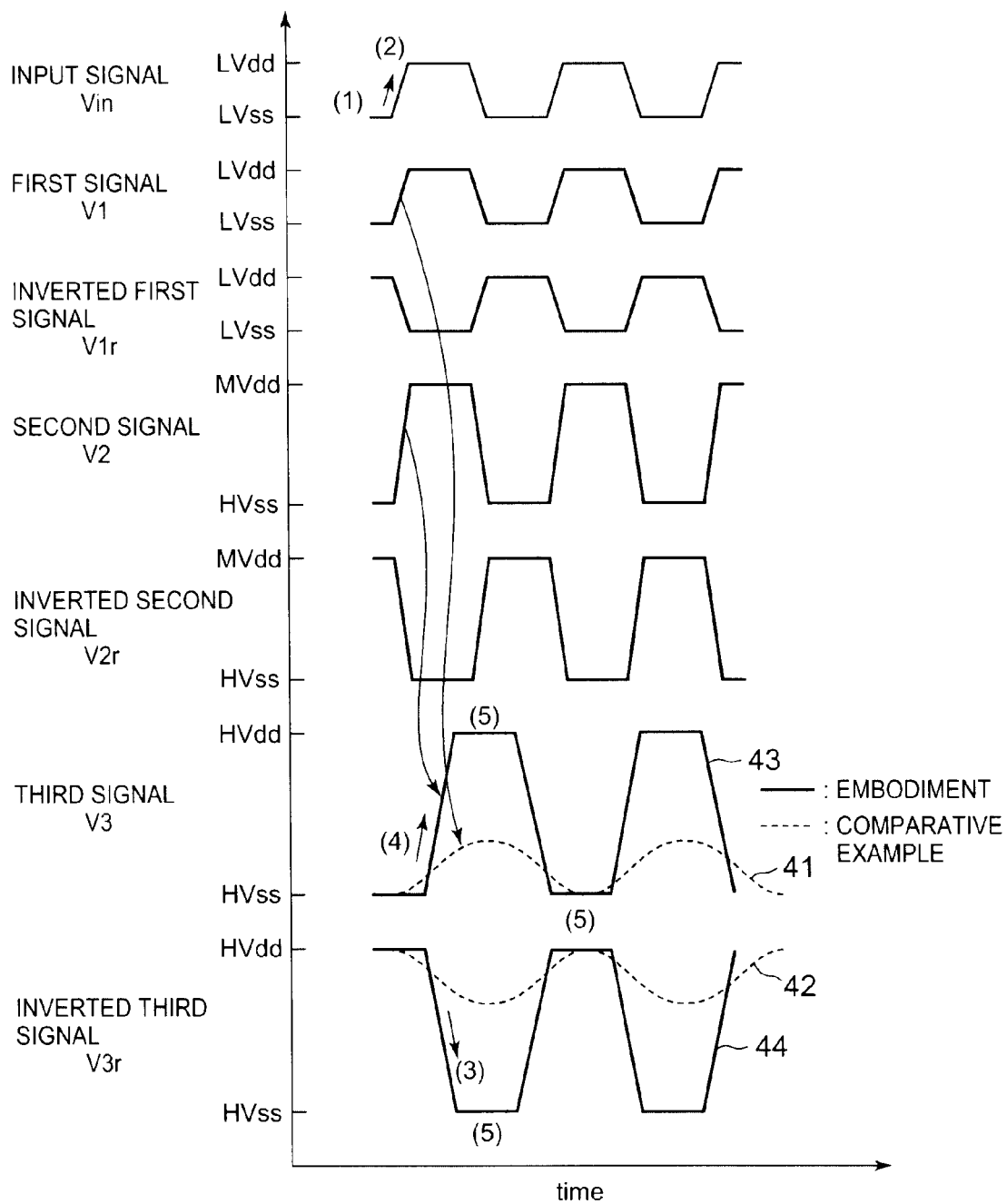
FIG. 3 is a timing chart showing an operation of the level conversion circuit according to the first embodiment of the present invention.

A level conversion circuit according to a first embodiment is explained referring to FIG. 1 to FIG. 3. FIG. 1 is a circuit diagram showing the level conversion circuit according to the first embodiment, and FIGS. 2A and 2B show an intermediate voltage generating portion used in the level conversion circuit shown in FIG. 1. FIG. 3 is a timing chart which shows an operation of the level conversion circuit according to the first embodiment.

As shown in FIG. 1, the level conversion circuit 10 according to this embodiment includes an intermediate voltage generating portion 13 which generates an intermediate voltage MVdd between a first voltage LVdd supplied from a first power supply source 11 and a second voltage HVdd having a higher voltage value than the first voltage LVdd, supplied from a second power supply source 12 upon receiving the first and second voltages LVdd and HVdd. The level conversion circuit 10 further includes a buffer portion 14 to output a second signal V2 with a second amplitude and an inverted second signal V2r, corresponding to the intermediate voltage level. The buffer portion 14 is operated by the intermediate voltage MVdd on receiving the first signal V1 and an inverted first signal V1r with a first amplitude corresponding to the first voltage LVdd. A level shift portion 15 is connected to the buffer portion 14 so as to receive the second signal V2 and the inverted second signal V2r. The level shift portion 15 is driven by the second voltage HVdd and outputs a third signal V3 and an inverted third signal V3r with a third amplitude corresponding to the second voltage HVdd.

Furthermore, the level conversion circuit 10 includes a buffer portion 16 operated by the first voltage LVdd. The buffer portion 10 outputs the first signal V1 and the inverted first signal V1r on receiving an input signal Vin with the first amplitude.

Here, for example, the first voltage LVdd is set to 1.2V to operate a digital integrated circuit, the second voltage HVdd is set to 3.3V to operate an analog integrated circuit, and the intermediate voltage MVdd is an intermediate voltage between 1.2V and 3.3V, for example, 2V. Low potentials LVss, MVss, and HVss are set, for example, to a reference potential GND, respectively.

The first amplitude of the first signal V1 and the inverted first signal V1r is a level (LVdd-LVss), that is, 1.2V. The first amplitude of the input signal Vin is the same as that of the first signal V1 and the inverted first signal V1r. The second amplitude of the second signal V2 and the inverted second signal V2r is a level (MVdd-MVss), for example, 2V. The third amplitude of the third signal V3 and the inverted third signal V3r is a level (HVdd-HVss), for example, 3.3V.

The buffer portion 16 includes a first inverter 21 that outputs the inverted first signal V1r upon receiving the input signal Vin, and a second inverter 22 that is connected in series with the first inverter 21 and outputs the first signal V1.

The buffer portion 14 includes a third inverter 23 that outputs the inverted second signal V2r upon receiving the first input signal V1, and a fourth inverter 24 that outputs the second signal V2 upon receiving the inverted first signal V1r.

The inverters 21 and 22 are constituted by CMOS inverters formed of a P channel MOS transistor and an N channel MOS transistor with an threshold voltage of approximately 0.4 V respectively, in which a fast switching operation of the respective MOS transistors is possible though withstand voltages are low. The inverters 23 and 24 are also constituted by CMOS inverters formed of a P channel MOS transistor and an N channel MOS transistor with a threshold voltage of approximately 0.6V, respectively.

The level shift portion 15 includes a pair of enhancement type N channel insulation gate field effect transistors (hereinafter called an N channel MOS transistor) 25 and 26 having gates to receive the second signal V2 and the inverted second signal V2r respectively and sources connected commonly to the low voltage potential HVss. The level shift portion 15 further includes a pair of enhancement type P channel insulation gate field effect transistors (hereinafter called a P channel MOS transistor) 27 and 28 connected to the respective drains of the N channel MOS transistors 25 and 26 as loads. The pair of P channel MOS transistors has drains, gates cross-coupled to the drains each other and sources commonly connected to the second power supply source 12.

A third signal V3 is outputted from a first output node N1 formed by connecting the drains of the N channel MOS transistor 26 and the P channel MOS transistor 28, and the inverted third signal V3r is outputted from a second output node N2 formed by connecting the drains of the N channel MOS transistor 25 and the P channel MOS transistor 27.

The intermediate voltage generating portion 13 is operated by the second voltage HVdd and includes a P channel MOS transistor 31 in which a gate is connected to the first power supply source 11, and a drain is connected to a constant current source 30 as shown in FIG. 2A. The intermediate voltage generating portion 13 also includes an inverting amplifier 32 in which an input terminal 32a is connected to a connection node N3 of the drain of the P channel MOS transistor 31 and the constant current source 30, and an output terminal 32b is connected to a source of the P channel MOS transistor 31.

The intermediate voltage generating portion 13 constitutes a negative feedback amplifying circuit. While the first fixed voltage LVdd is supplied to the gate of the P channel MOS transistor 31, a source voltage, that is, an output voltage of the inverting amplifier 32 is supplied to the source so that a predetermined bias current Ib1 flows in the source of the P channel MOS transistor 31.

Thereby, an intermediate voltage MVdd of a sum of the first voltage LVdd and the voltage Vgs between the gate and the source of the P channel MOS transistor 31 is obtained at a connection node N4 of the source of the P channel MOS transistor 31 and the output terminal 32b of the inverting amplifier 32.

As shown in FIG. 2B, specifically, the inverting amplifier 32 includes an N channel MOS transistor 34 in which a gate is used as an input terminal 32a, a source is connected to a low potential MVss, and a drain is connected to the current source 33. The inverting amplifier 32 also includes an N channel MOS transistor 35 in which a source is used as an output terminal 32b, a drain is connected to the second power supply source 12, and a gate is connected to a connection node N5 of the drain of the N channel MOS transistor 34 and the constant current source 33.

The intermediate voltage MVdd is expressed with the following formula with respect to the first voltage LVdd.

$$MVdd = LVdd + Vthp + \Delta Voff \quad (1)$$

$$\Delta Voff = \sqrt{(Ib1/(\mu_p C_{ox} Wp/(2Lp)))} \quad (2)$$

Here, Vthp is an absolute value of the threshold voltage, Wp is a gate width, Lp is a gate length, $\mu_p$ is electron mobility in the channel, and $C_{ox}$ is unit capacity of a gate insulating film of the P channel MOS transistor 31, respectively.

Since $\Delta$Voff can be made smaller enough than the threshold voltage Vthp by enlarging Wp/Lp and setting up Ib1 small, the intermediate voltage MVdd is expressed with the following formula.

$$MVdd \approx LVdd + Vthp \quad (3)$$

If the threshold voltage Vthp is set to 0.8V, the intermediate voltage MVdd is set to 2V. Consequently, a voltage value near the intermediate value (2.25V) between the first voltage LVdd and the second voltage HVdd is obtained.

By means of above setting of the parameters, a condition, that is, the sum of the first voltage LVdd and the absolute value of the threshold voltage of the P channel MOS transistor used for the inverters 23 and 24 is larger than the intermediate voltage MVdd for steady current not to flow in the inverters 23 and 24 of the buffer portion 14, which operates on the intermediate voltage MVdd as mentioned later, is almost satisfied.

Figure 4:
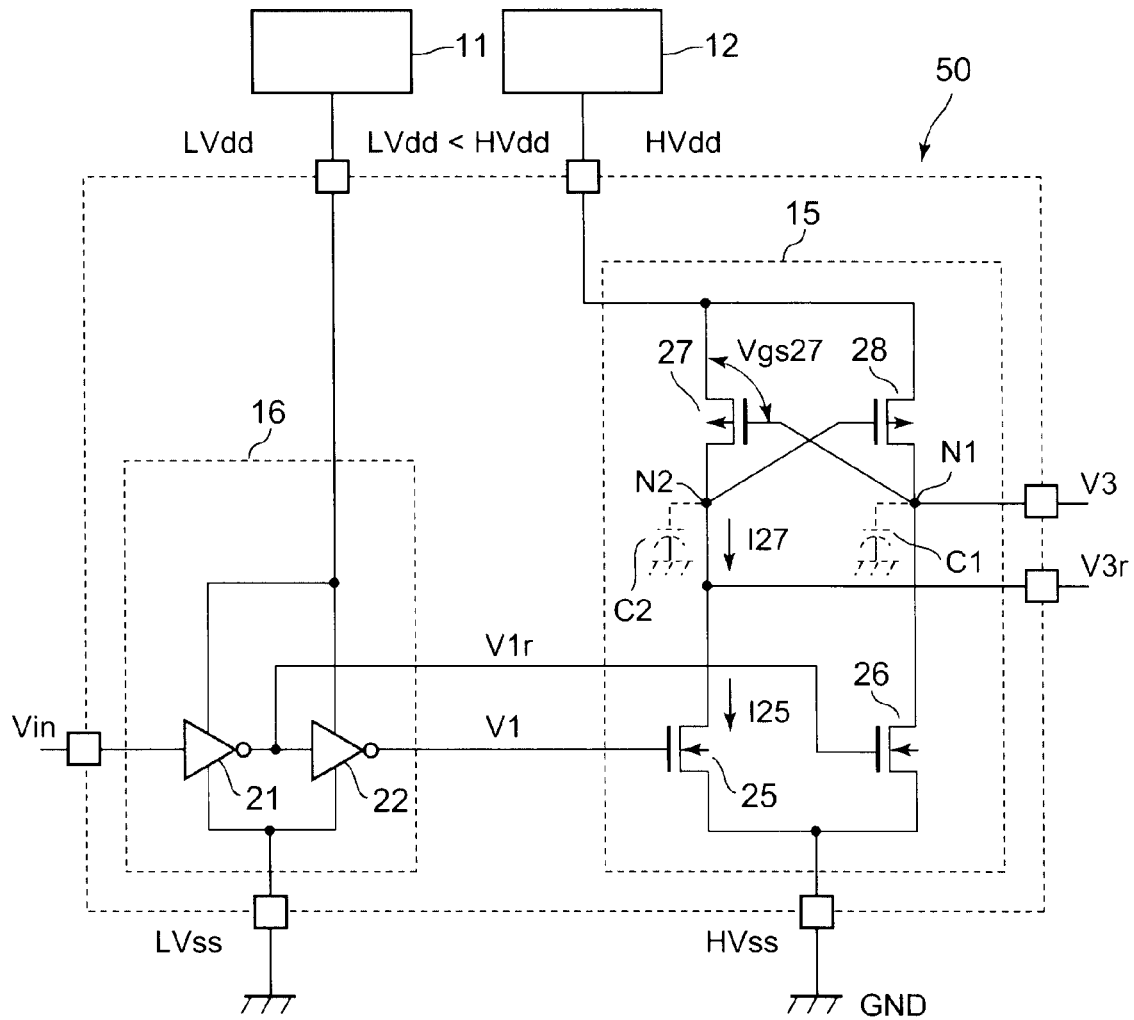
FIG. 4 is a circuit diagram showing a level conversion circuit of a comparative example.

Next, the operation of the level conversion circuit 10 according to this invention is explained as contrasted with a comparative example. In the level conversion circuit 50 according to the comparative example, the intermediate voltage generating portion 13 and the buffer portion 14 are not used, as shown in FIG. 4.

First, the operation of the level conversion circuit 50 of the comparative example is explained. In a usual operation, the level conversion circuit 50 receives an input signal Vin which has a first amplitude (LVdd-LVss), then, decides an output logic, and outputs a third signal V3 and the inverted third signal V3r which have a larger amplitude (HVdd-HVss) than the first amplitude. Here, the low potentials LVss and HVss are both reference potentials GND.

As shown in FIG. 3, in the level conversion circuit 50 of the comparative example, when the input signal Vin is in L level (LVss) state, the first signal V1 is L level (LVss), the inverted first signal V1r is set to H level (LVdd), the third signal V3 is set to L level (HVss), and the inverted third signal V3r is set to H level (HVdd). Consequently, the logic state is decided (state 1).

Next, the moment the input signal Vin changes from L level to H level, the first signal V1 changes to H level (LVdd) from L level, a voltage of LVdd is impressed between a gate and a source of an N channel MOS transistor 25, which makes the N channel MOS transistor 25 conductive. Moreover, since the inverted first signal V1r changes to L level (LVss) from H level, an N channel MOS transistor 26 becomes in a cut-off state (state 2).

In this state, a voltage |Vgs27| between a gate and a source of a P channel MOS transistor 27 is HVdd, and the P channel MOS transistor 27 is turned on. Therefore, a drain current flows in both the N channel MOS transistor 25 and the P channel MOS transistor 27, respectively.

By a current difference (I25-I27) between a current I25 which flows through the N channel MOS transistor 25 and a current I27 which flows through the P channel MOS transistor 27, charges in a parasitic capacitance C2 at a second output node N2 is discharged. Accordingly, the potential of the second output node N2 falls (state 3).

A gate voltage of a P channel MOS transistor 28 falls with a decrease in a potential of the second output node N2, thereby the P channel MOS transistor 28 becomes conductive, and a current starts flowing in the P channel MOS transistor 28. Since the N channel MOS transistor 26 maintains a cutoff state, the parasitic capacitance C1 at the first output node N1 is charged by the current which flows through the P channel MOS transistor 28, thereby the potential of the first output node N1 rises (state 4).

When the potential of the first output node N1 goes up, a voltage |Vgs27| between the gate and the source of the P channel MOS transistor 27 becomes small. As a result, a current difference (I25-I27) becomes large, and a series of positive feedback operations are performed, which results in a decrease in the potential of the second output node N2 at higher speed. Finally, the potential of the second output node N2 becomes L level (HVss), and the potential of the first output node N1 becomes to H level (HVdd) (state 5).

In the level shift circuit 50 of the comparative example, when the first low voltage LVdd is low and the second voltage HVdd is high, that is, a ratio of amplitude of the input signal Vin to amplitudes of the third signal V3 and the inverted third signal V3r after the level shift is large, it becomes difficult to achieve a high-speed operation for the following reasons.

In the state 3 as mentioned above, the speed which reduces the potential of the second output node N2 is decided by largeness of the current difference (I25-I27). The currents I25 and I27 are expressed with the following formula.

$$I25 = \mu_n C_{ox}(Wn1/Ln1)(LVdd - Vthn25)^2/2 \quad (4)$$

$$I27 = \mu_p C_{ox}(Wp1/Lp1)(HVdd - Vthp27)^2/2 \quad (5)$$

Here, $\mu_n$ and $\mu_p$, are respectively electron mobility in the channel, Cox is unit capacity of respective gate insulating films, Wn1/Ln1 and Wp1/Lp1 are respective ratios of a gate width to a gate length, and Vthn25 and Vthp27 are respective threshold voltages of the channels of the N channel MOS transistor 25 and the P channel MOS transistor 27.

The larger the current difference (I25-I27) becomes, the higher-speed operation becomes possible to reduce the potential of the second output node N2. However, the larger the difference between the second voltage HVdd and the first voltage LVdd becomes, the smaller the current difference (I25-I27) becomes. Consequently, the high-speed operation becomes difficult. Since a rising speed, a falling speed, and an amplitude of the respective third signal V3 and inverted third signal V3r are reduced, it becomes impossible, as a result, to decide a logic value, as shown in the dashed lines 41 and 42 in FIG. 3.

That is, in the level conversion circuit 50 of the comparative example, the larger the ratio of the voltage (V1, V1r) before the level shift to the voltage (V3, V3r) after the level shift becomes, the higher-speed operation becomes difficult. The reason is why the level conversion circuit 50 cannot simultaneously raise both the rising speed and the falling speed of signals, when transferring the signal to the high-voltage side from the low-voltage side.

On the contrary, the level conversion circuit 10 according to this embodiment includes the buffer portion 14 which operates on the intermediate voltage MVdd between the first voltage LVdd and the second voltage HVdd. As a result, since the ratio of the voltage (V2, V2r) before the level shift to the voltage (V3, V3r) after the level shift in the level shift portion 15 becomes smaller than that of the comparative example, it is possible to accelerate the signal transfer in the level shift portion 15 from the buffer portion 14, as shown in the solid lines 43 and 44.

Since the inverters 23 and 24 of the buffer portion 14 are formed of CMOS inverters, the speed of the logic inverting operation is higher than that of the level shift portion 15 using the positive feed-back operation. Therefore, the buffer portion 14 hardly affects the operation speed of the level conversion circuit 10.

However, if the intermediate voltage MVdd which is the voltage to operate the inverters 23 and 24 is larger than a sum of the first LVdd and the absolute value of the threshold voltage of the P channel MOS transistor used for the CMOS inverter, a direct-current flows in the inverters 23 and 24. Therefore, useless electric power is consumed.

Accordingly, it is preferable to satisfy the conditions that the intermediate voltage MVdd is smaller than the sum of the first voltage LVdd and the absolute value of the threshold voltage of the P channel MOS transistor used for the CMOS inverter. Specifically, the Δ Voff shown in the formula 2 is made smaller enough than the threshold voltage Vthp.

It is still more desirable if the absolute value of the threshold voltage of the P channel MOS transistor used for the inverters 23 and 24 is set up larger than the absolute value of the threshold of the P channel MOS transistors 27 and 28 used for the level shift portion 15.

Usually, since the power supply voltage values of an IC or an LSI are decided by a circuit specification, the first voltage LVdd and the second voltage HVdd of the level conversion circuit are fixed. Accordingly, what is necessary is just to set the intermediate voltage MVdd as a value so that the shift portion 15 secures an operating speed decided by the parasitic capacitances C1 and C2 accompanied by the first and second output nodes N1 and N2, and that the buffer portion 14 does not consume useless electric power.

As explained above, the level conversion circuit 10 according to this embodiment, the buffer portion 14 operated by the intermediate voltage MVdd between the first voltage LVdd and the second voltage HVdd is interposed between the buffer portion 16 operated by the first voltage LVdd, and the level shift portion 15 operated by the second voltage HVdd higher than the first voltage LVdd.

As a result, since the ratio of the voltage (V2, V2r) before the level shift to the voltage (V3, V3r) after the level shift in the level shift portion 15 becomes smaller than that of the comparative example, the signal transfer in the level shift portion 15 from the buffer portion 14 can be accelerated. Accordingly, even if the ratio of the amplitude of the input signal Vin to the amplitudes of the third signal V3 and the inverted third signal V3r after the level shift is large, the level conversion circuit 10 can still achieve a high speed operation.

Furthermore, since a circuit scale of the intermediate voltage generating portion 13 and the buffer portion 14 is small, the influence to affect to a chip size is few when integrating the level conversion circuit 10 with a digital circuit operated by the first voltage LVdd, and an analog circuit operated by the second voltage HVdd.

Here, although a case where the level conversion circuit 10 includes the buffer portion 16 is explained, a different structure may be adopted so that the first signal V1 and the inverted first signal V1r are supplied from the exterior.

Figure 5:
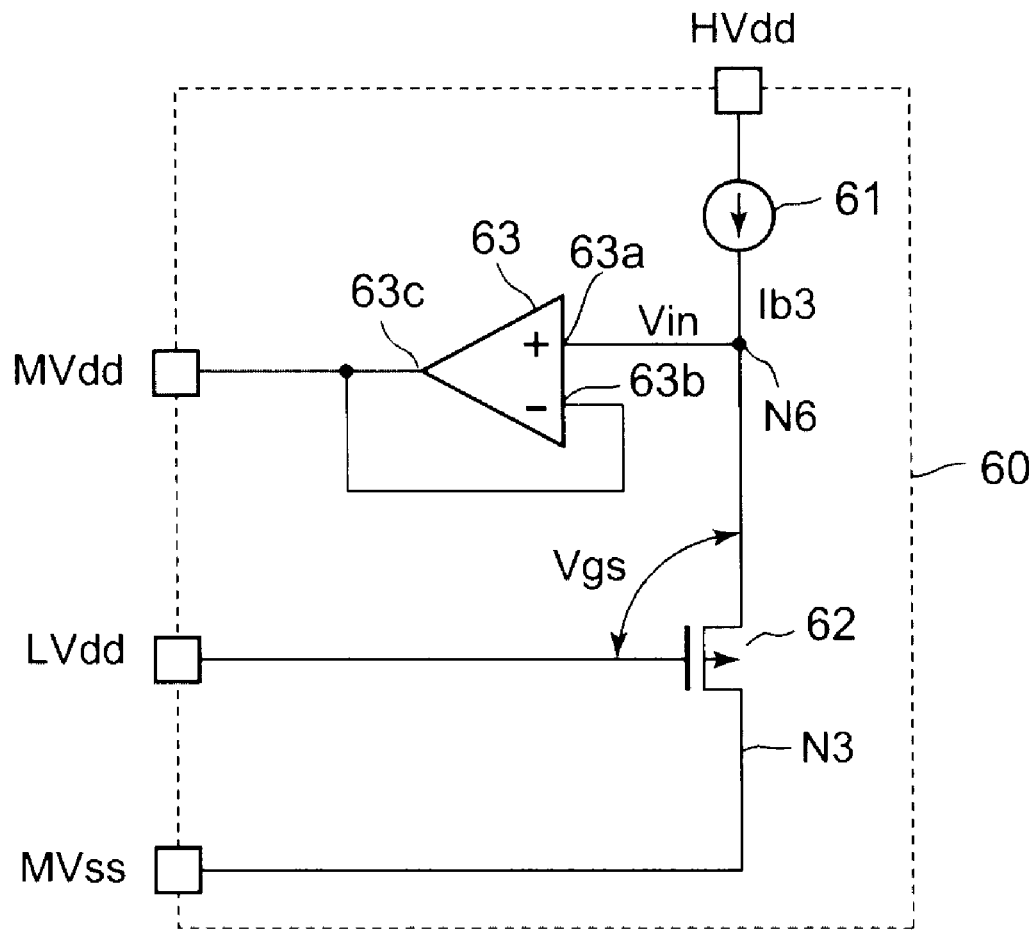
FIG. 5 is a circuit diagram showing an intermediate voltage generating portion used in a level conversion circuit according to a second embodiment of the present invention.

FIG. 5 is a circuit diagram showing an intermediate voltage generating portion according to a second embodiment of the present invention. An intermediate voltage generating portion 60 includes a P channel MOS transistor 62 operates on the second voltage HVdd, in which a gate is connected to the first power supply source 11, and a source is connected to a constant current source 61 as shown in FIG. 5. The intermediate voltage generating portion 60 also includes a differential amplifier 63 in which a positive input terminal 63a is connected to a connection node N6 of a source of a P channel MOS transistor 62 and the constant current source 61, and a negative input terminal 63b and an output terminal 63c of the differential amplifier 63 are connected.

The intermediate voltage generating portion 60 applies the first fixed voltage LVdd to a gate of the P channel MOS transistor 62 to make flow a predetermined bias current Ib3 through the P channel MOS transistor 62. The intermediate voltage generating portion 60 operates so that voltages of the positive input terminal 63a of the differential amplifier 63 and the negative input terminal 63b become equal.

Since the voltage Vin of the connection node N6 turns into a voltage of a sum of the first voltage LVdd and the voltage Vgs between the gate and the source of the P channel MOS transistor 62 like the formula 1 and the formula 2, an intermediate voltage MVdd equal to the voltage Vin is obtained. If the bias current Ib3 is made equal to the bias current Ib1 in FIGS. 2A and 2B, the intermediate voltage MVdd equal to the intermediate voltage generating portion 13 is obtained.

However, in the intermediate voltage generating portion 13, if the intermediate voltage MVdd becomes larger than the voltage difference between the second voltage HVdd and the threshold voltage of the N channel MOS transistor 35 due to the circuit structure, the N channel MOS transistor 35 is cut off. Accordingly, the intermediate voltage MVdd is restricted to a voltage less or equal to the voltage difference between the second voltage HVdd and the threshold voltage of the N channel MOS transistor 35.

On the other hand, the intermediate voltage generating portion 60 can set up the intermediate voltage MVdd arbitrarily corresponding to the bias current Ib3 from a voltage equal to a sum of the first voltage LVdd and the threshold voltage of the P channel MOS transistor 62 to the voltage equal to the second voltage HVdd.

The intermediate voltage generating portion 60 is suitable in a case where the buffer portion 14 needs the intermediate voltage MVdd which is larger than the voltage difference between the second voltage HVdd and the threshold voltage of the N channel MOS transistor 35, for example, when the voltage difference of the first voltage LVdd and the second voltage HVdd is small.

Figure 6:
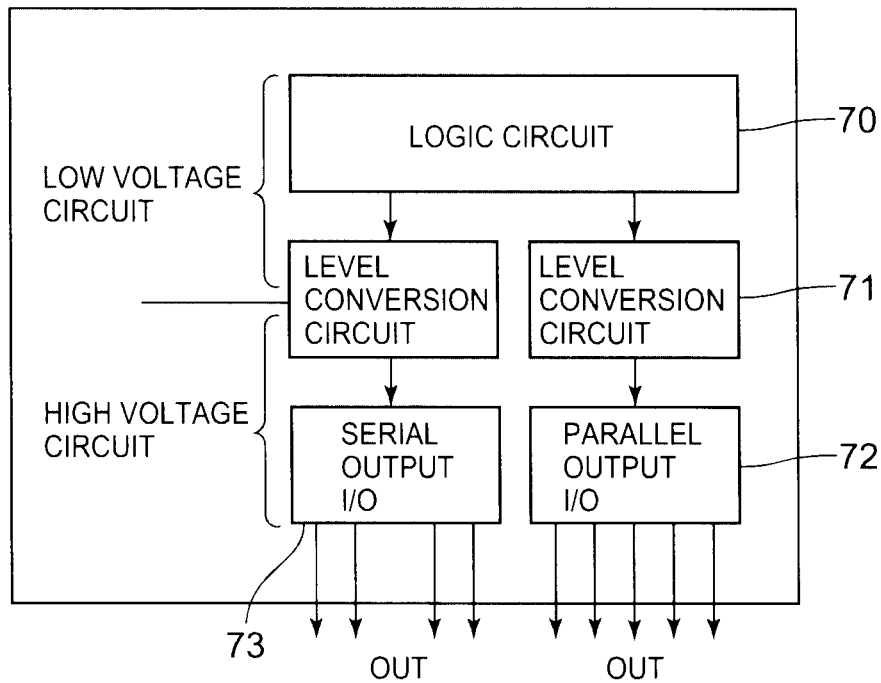
FIGS. 6 and 7 are circuit diagrams showing the level conversion circuits integrated in ICs.

FIG. 6 is a block diagram showing a state where the level conversion circuit according to the embodiment is integrated in an IC. In the IC, the level conversion circuits 71 are connected between output terminals of a logic circuit 70, which operates on comparatively low voltage, and a serial output I/O portion 73 and a parallel output I/O portion 72 which operate on a higher voltage respectively. The IC is useful when transferring a signal to a high-voltage circuit from a low-voltage circuit at high speed.

Figure 7:
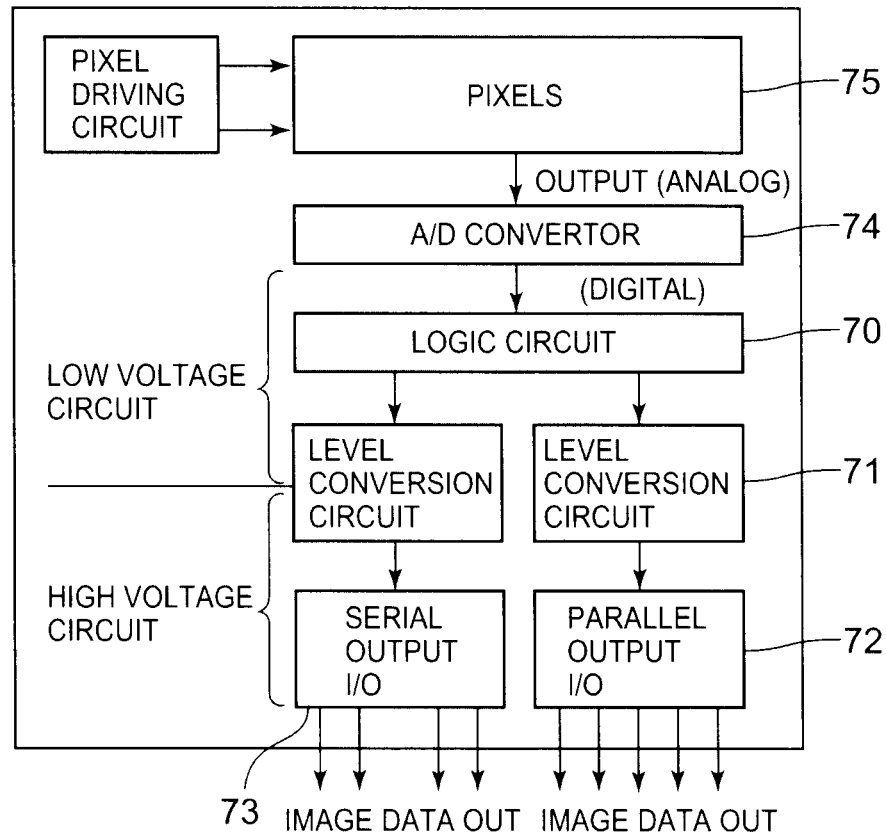

FIG. 7 is a block diagram showing an example in which the level conversion circuit is applied a solid-state imaging device. Analog image signals from pixels 75 which are formed of CMOS optical sensor elements are converted to digital signals by an A/D converter 74, and inputted to the logic circuit 70. Generally, the logic circuit 70 is formed of transistors with a high integration rate which operate on comparatively low voltage. Moreover, an input and output portion I/O of the IC operates on a higher voltage. The level conversion circuits 71 are respectively connected between the logic circuit 70 which operates on a lower voltage and a serial output portion (I/O) 73 and a parallel output portion (I/O) 72 which operate on a higher voltage. In this IC, it becomes possible to transfer the image data with high-speed and high accuracy between the circuits where the operating voltage levels are different each other in the IC. Accordingly, the IC including the level conversion circuit according to the embodiment is useful for a solid-state imaging device to transfer image data at high speed.

In addition, it is also possible to constitute the intermediate voltage generating portion in FIG. 1 by two or more intermediate voltage generating portions 13 (13-1, 13-2, . . . ) and also constitute the buffer portions by two or more buffer portions 14 (14-1, 14-2, . . . ) which operate on respective outputs of the corresponding intermediate voltage generating portions 13 (13-1, 13-2, . . . ) as other cases. In this case, the buffer portions 14 (14-1, 14-2, . . . ) are connected to the shift portions 15 (15-1, 15-2, . . . ) formed corresponding to the buffer portions 14 (14-1, 14-2, . . . ).

While certain embodiments have been described, these embodiments have been presented by way of example only, and are not intended to limit the scope of the inventions. In practice, the structural elements can be modified without departing from the spirit of the invention. Various embodiments can be made by properly combining the structural elements disclosed in the embodiments. For example, some structural elements may be omitted from all the structural elements disclosed in the embodiments. Furthermore, structural elements in different embodiments may properly be combined. The accompanying claims and their equivalents are intended to cover such forms or modifications as would fall with the scope and spirit of the inventions.

What is claimed is:

1. A level conversion circuit, comprising:
an intermediate voltage generating portion to generate an intermediate voltage between a first voltage supplied from a first power supply source and a second voltage supplied from a second power supply source upon receiving the first voltage and the second voltage higher than the first voltage;

a first buffer portion operated by the intermediate voltage to receive a first signal and an inverted first signal of a first amplitude corresponding to the first voltage, the first buffer portion outputting a second signal and an inverted second signal having a second amplitude corresponding to the intermediate voltage; and a level shift portion operated by the second voltage to receive the second signal and the inverted second signal, and to output a third signal and an inverted third signal having a third amplitude corresponding to the second voltage, wherein the intermediate voltage generating portion includes, a P channel MOS transistor operated by the second voltage having a source, a gate connected to the first power supply source and a drain connected to a constant current source, and an inverting amplifier having an input terminal connected to a connection node of the drain of the P channel MOS transistor and the constant current source, and an output terminal connected to the source of the P channel MOS transistor, and wherein the intermediate voltage is outputted from a connection node between the source of the P channel MOS transistor and the output terminal of the inverting amplifier, the intermediate voltage being equal to a sum of the first voltage and a voltage between the gate-source of the P channel MOS transistor.

2. The level conversion circuit according to claim 1, further comprising a second buffer portion operated by the first voltage which outputs the first signal and the inverted first signal upon receiving an input signal having the first amplitude.

3. The level conversion circuit according to claim 2, wherein the second buffer portion includes a first inverter circuit to output the inverted first signal upon receiving an input signal and a second inverter circuit connected in series with the first inverter circuit to output the first signal.

4. The level conversion circuit according to claim 3, wherein the first and second inverter circuits are respectively formed of a CMOS inverter including a P channel MOS transistor and an N channel MOS transistor.

5. The level conversion circuit according to claim 1, wherein the first buffer portion to output the second signal and the inverted second signal includes a third inverter circuit to output the inverted second signal upon receiving the first signal and a fourth inverter circuit to output the second signal upon receiving the inverted first signal.

6. The level conversion circuit according to claim 5, wherein the third and fourth inverter circuits are respectively formed of a CMOS inverter including a P channel MOS transistor and an N channel MOS transistor.

7. The level conversion circuit according to claim 1, wherein the inverting amplifier includes, a first N channel MOS transistor having a gate as an input terminal, a source connected to a reference potential and a drain connected to a constant current source, and a second N channel MOS transistor having a source as an output terminal, a drain connected to the second power supply source, and a gate connected to a connection node of the drain of the first N channel MOS transistor and the constant current source.

8. The level conversion circuit according to claim 1, wherein the level shift portion includes, a pair of N channel MOS transistors each having a drain, a gate to receive the second signal and the inverted second signal respectively and a source, the sources commonly connected to a reference potential, a pair of P channel MOS transistors connected to the drains of the pair of N channel MOS transistors as loads respectively, each having a source commonly connected to the second power source, and a gate and a drain cross-coupled each other, and wherein the third signal and the inverted third signal are outputted respectively from a pair of connection nodes of the pair of N channel MOS transistor and the pair of P channel MOS transistors.

9. A level conversion circuit, comprising:

an intermediate voltage generating portion to generate an intermediate voltage between a first voltage supplied from a first power supply source and a second voltage supplied from a second power supply source upon receiving the first voltage and the second voltage higher than the first voltage;

a first buffer portion operated by the intermediate voltage to receive a first signal and an inverted first signal of a first amplitude corresponding to the first voltage, the first buffer portion outputting a second signal and an inverted second signal having a second amplitude corresponding to the intermediate voltage; and a level shift portion operated by the second voltage to receive the second signal and the inverted second signal, and to output a third signal and an inverted third signal having a third amplitude corresponding to the second voltage, wherein the intermediate voltage generating portion includes, a P channel MOS transistor operated by the second voltage having a gate connected to the first power source and a source connected to a constant current source, and a differential amplifier having a first input terminal connected to a connection node of the source of the P channel MOS transistor and the constant current source, a second input terminal, and an output terminal connected to the second input terminal, and wherein the differential amplifier outputs an intermediate voltage having a voltage value equal to a sum of the first voltage and a voltage between the gate source of the P channel MOS transistor.

10. A level conversion circuit, comprising:

an intermediate voltage generating portion to generate an intermediate voltage between a first voltage supplied from a first power supply source and a second voltage supplied from a second power supply source upon receiving the first voltage and the second voltage higher than the first voltage;

a first buffer portion operated by the intermediate voltage to receive a first signal and an inverted first signal of a first amplitude corresponding to the first voltage, the first buffer portion outputting a second signal and an inverted second signal having a second amplitude corresponding to the intermediate voltage; and a level shift portion operated by the second voltage to receive the second signal and the inverted second signal, and to output a third signal and an inverted third signal having a third amplitude corresponding to the second voltage, wherein the first voltage is a voltage for operating a digital IC, and the second voltage is a voltage for operating an analogue IC.

11. A level conversion circuit, comprising:
a plurality of intermediate voltage generating portions to generate intermediate voltages, respectively, between a first voltage supplied from a first power supply source and a second voltage supplied from a second power supply source upon receiving the first voltage and the second voltage higher than the first voltage;
a plurality of first buffer portions connected to the respective intermediate voltage generating portions and operated by the intermediate voltages, and which receive a first signal and an inverted first signal of a first amplitude corresponding to the first voltage, the respective first buffer portions outputting a second signal and an inverted second signal having a second amplitude corresponding the intermediate voltage; and
a plurality of level shift portions connected to the respective first buffer portions and each operated by the second voltage to receive the second signal and the inverted second signal, the respective level shift portions outputting a third signal and an inverted third signal having a third amplitude corresponding to the second voltage,
wherein the respective intermediate voltage generating portions include,
a P channel MOS transistor operated by the second voltage having a source, a gate connected to the first power supply source and a drain connected to a constant current source, and
an inverting amplifier having an input terminal connected to a connection node of the drain of the P channel MOS transistor and the constant current source, and an output terminal connected to the source of the P channel MOS transistor, and
wherein the respective intermediate voltages are outputted from a connection node between the source of the P channel MOS transistor and the output terminal of the inverting amplifier, the respective intermediate voltages being equal to a sum of the first voltage and a voltage between the gate-source of the P channel MOS transistor.

12. The level conversion circuit according to claim 11, further comprising a second buffer portion operated by the first voltage to output the first signal and the inverted first signal upon receiving an input signal having the first amplitude.

13. The level conversion circuit according to claim 11, wherein the respective level shift portions include,
a pair of N channel MOS transistors each having a drain, a gate to receive the second signal and the inverted second signal respectively, and a source each commonly connected to a reference potential,
a pair of P channel MOS transistors connected to the drains of the pair of N channel MOS transistors as loads respectively, each having a source commonly connected to the second power source, and a gate and a drain cross-coupled each other, and
wherein a third signal and an inverted third signal are outputted respectively from a pair of connection nodes of the pair of N channel MOS transistor and the pair of P channel MOS transistors.

14. The level conversion circuit according to claim 11, wherein the first voltage is a voltage for operating a digital IC, and the second voltage is a voltage for operating an analogue IC.

15. A level conversion circuit, comprising:
a plurality of intermediate voltage generating portions to generate intermediate voltages, respectively, between a first voltage supplied from a first power supply source and a second voltage supplied from a second power supply source upon receiving the first voltage and the second voltage higher than the first voltage;
a plurality of first buffer portions connected to the respective intermediate voltage generating portions and operated by the intermediate voltages, and to receive a first signal and an inverted first signal of a first amplitude corresponding to the first voltage, the respective first buffer portions outputting a second signal and an inverted second signal having a second amplitude corresponding the intermediate voltage; and
a plurality of level shift portions connected to the respective first buffer portions and each operated by the second voltage to receive the second signal and the inverted second signal, the respective level shift portions outputting a third signal and an inverted third signal having a third amplitude corresponding to the second voltage,
wherein the respective intermediate voltage generating portion includes,
a P channel MOS transistor operated by the second voltage having a gate connected to the first power supply source and a source connected to a constant current source, and
a differential amplifier having a first input terminal connected to a connection node of the source of the P channel MOS transistor and the constant current source, a second input terminal, and an output terminal connected to the second input terminal, and
wherein the respective differential amplifiers output an intermediate voltage having a voltage value equal to a sum of the first voltage and a voltage between the gate-source of the P channel MOS transistor.

16. A solid-state imaging device, comprising:
a plurality of pixels each including a photoelectric conversion element;
an A/D convertor connected to the pixels to convert an analogue signal from the pixels to a digital signal;
a logic circuit connected to the A/D convertor and operated by a first voltage supplied from a first power supply source;
an input/output circuit operated by a second voltage supplied from a second power supply source larger than the first voltage; and
a level conversion circuit connected between the logic circuit and the input/output circuit; and wherein the level conversion circuit includes,
an intermediate voltage generating portion to generate an intermediate voltage between the first voltage supplied from the first power source and the second voltage supplied from the second power source upon receiving the first voltage and the second voltage higher than the first voltage;
a first buffer portion operated by the intermediate voltage to receive a first signal and an inverted first signal of a first amplitude corresponding to the first voltage, the first buffer portion outputting a second signal and an inverted second signal having a second amplitude corresponding the intermediate voltage; and
a level shift portion operated by the second voltage to receive the second signal and the inverted second signal, and to output the third signal and the inverted third signal having a third amplitude corresponding to the second voltage.

17. The solid-state imaging device according to claim 16, wherein the photoelectric conversion element is formed of a CMOS optical sensor element.

* * * * *